(12) United States Patent
Hilliard (10) Patent No.: US 6,265,033 B1
(45) Date of Patent: Jul. 24, 2001

(54) METHOD FOR OPTICALLY COUPLED VAPOR DEPOSITION

(76) Inventor: Donald Bennett Hilliard, 3050 N. Fontana, Tucson, AZ (US) 85705

( * ) Notice: Subject to any disclaimer, the term of this patent is extended or adjusted under 35 U.S.C. 154(b) by 0 days.

(21) Appl. No.: 09/394,554

(22) Filed: Sep. 10, 1999

Related U.S. Application Data (60) Provisional application No. 60/099,964, filed on Sep. 11, 1998.

(51) Int. Cl.[7] .......................... C23C 14/28; C23C 14/24; C23C 14/14; B05P 3/06
(52) U.S. Cl. ......................... 427/561; 427/584; 427/582; 427/597
(58) Field of Search .................................. 427/561, 566, 427/567, 582, 583, 584, 595, 597

(56) References Cited

U.S. PATENT DOCUMENTS

| | | | |
|---|---|---|---|
| 3,654,109 | * | 4/1972 | Hohl et al. .......................... 427/595 |
| 4,183,780 | | 1/1980 | McKenna . |
| 4,184,749 | | 1/1980 | Grossman . |
| 4,615,034 | | 9/1986 | von Gunter . |
| 4,664,769 | | 5/1987 | Cuomo . |
| 4,779,286 | | 10/1988 | Wheatley . |
| 4,783,789 | | 11/1988 | Higgins . |
| 4,798,952 | | 1/1989 | Fink . |
| 4,799,454 | | 1/1989 | Hiroki . |
| 4,842,686 | | 6/1989 | Davis . |
| 4,945,547 | | 7/1990 | Greene . |
| 4,987,007 | | 1/1991 | Wagal . |
| 5,062,116 | | 10/1991 | Christensen . |
| 5,096,739 | * | 3/1992 | Strutt et al. .......................... 427/597 |
| 5,205,870 | * | 4/1993 | Sato et al. ............................ 427/582 |
| 5,415,901 | * | 5/1995 | Tanaka et al. ....................... 427/561 |
| 5,433,791 | | 7/1995 | Brewer . |
| 5,441,569 | | 8/1995 | Veligdon . |
| 5,672,210 | * | 9/1997 | Moto et al. .......................... 427/596 |
| 5,691,280 | * | 11/1997 | Eckstein et al. ..................... 427/596 |
| 5,733,609 | * | 3/1998 | Wang .................................. 427/561 |
| 6,183,817 | * | 2/2001 | Gersonde ............................ 427/561 |

OTHER PUBLICATIONS

J.M. Gee, et al "Plasma–initiated laser deposition of poly-crystalline and mono–crystalline silicon Films" Mat. Res. Symp. Proc. (1984) p. 15–20, vol.29 Elselvier Science Pub. Co.

Victor F. Tarasenko, et al "Coaxial, Cylindrical, and Planar UV excilamps, . . . " SPIE vol. 2992 (1997), p. 24–34.

* cited by examiner

Primary Examiner—Marianne Padgett (57) ABSTRACT

A system for the depositing of insulating, conducting, or semiconducting thin films is disclosed, in which the sputtering plasma is irradiated with a transverse, adjustable ultraviolet emission produced by an ultraviolet optical cavity containing a lamp discharge. The cavity irradiates the sputtering plasma volume with a sufficiently high optical flux to enact significant changes in the film produced. This effect is enabled by the device geometry, which, in the preferred embodiment, provides uniquely high efficiency and stability in the optical coupling between the lamp discharge and the sputtering plasma, resulting in the ability to significantly alter ionized and excited state populations within and directly above the sputtering plasma. The design also allows the operator to significantly control the volume and species involved in the optical interaction.

15 Claims, 6 Drawing Sheets

METHOD FOR OPTICALLY COUPLED VAPOR DEPOSITION

RELATED APPLICATIONS

This application is related to U.S. Provisional Patent Application Number 60/099,964 filed Sep. 11, 1998.

BACKGROUND OF THE INVENTION

1. Field of the Invention

The present invention relates generally to vapor deposition methods and, in particular, a plasma sputtering apparatus by which thin or thick films of insulating, semiconductor, or conductive materials are formed. Potential applications exist in the fabrication of integrated circuits, optical elements, optoelectronic devices, and other such products requiring well-controlled physical properties in these same films.

2. Description of the Related Art

In one aspect, the invention relates generally to the treatment of dispersed photo absorbing media, such as gases, with ultraviolet radiation. An equipment geometry for this purpose, in fluid treatment, utilizes a flow-through geometry, wherein the media to be processed passes through a processing tube constructed of ultraviolet-transmitting material—such as fused silica—and wherein the tube is surrounded with one or several ultraviolet lamps, thereby creating a high radiative flux within the photo absorbing media. The coupling efficiency of the ultraviolet radiation to the media may then be increased, by placing this coaxial arrangement within a reflective cavity. This latter reflective cavity becomes increasingly necessary as the extinction distance of the ultraviolet within the media becomes much greater than the relevant physical dimension of the apparatus, and the ultraviolet radiation must make many passes through the media before it is appreciably absorbed.

The problems encountered with irradiating low absorption cross-section dispersed media become increasingly acute with lower pressure processes, wherein the dispersed media would typically be some gas or vapor which is rarified to a degree consistent with the level of vacuum. In these latter vacuum processes, one encounters situations wherein the absorbing constituent may have a vapor pressure of only $10^{-6}$ atmospheres, with extinction distances in the range of $10^2$ to $10^3$ meters. At the same time, these vacuum processes will frequently involve one or several critical material surfaces that interact with the process quite differently when irradiated with the ultraviolet radiation. These same critical surfaces will typically be modified during the process, so that the result of irradiating these surfaces will change, as well. For instance, a thin film forming on one of these material surfaces can dramatically alter the absorption, scatter, or reflection of the ultraviolet radiation as its thickness increases. In ultraviolet-enhanced physical vapor deposition (PVD) processes, including reactive processes utilizing PVD sources, these issues have not been adequately addressed.

A prevalent PVD means in industry for the deposition of high quality thin films is through the utilization of sputtering techniques. The term "sputtering" refers to a group of mechanisms by which material is ejected from a solid, or sometimes a liquid, target surface into a vapor form; this latter effect being due, at least in part, in either physical or chemical sputtering, to the kinetic energy transferred to the target atoms or molecules by bombarding particles. These mechanisms are utilized in sputter deposition processes categorized generally as laser sputtering, ion beam sputtering, glow discharge (or diode) sputtering, and magnetron glow discharge sputtering. The present invention, in its preferred embodiment, concerns primarily plasma sputtering, and, in particular, magnetron plasma sputtering. The magnetic confinement of the sputtering plasma in the magnetron sputtering process allows for a far greater range of mean free paths than the earlier, capacitively coupled diode plasma sputtering process. Its high deposition rate, combined with its versatility in depositing a wide range of materials under a great range of conditions, has made magnetron plasma sputtering a preferred thin film deposition technique for many industrial applications.

Yet, there are several aspects of plasma sputtering which are seen as significant barriers in utilizing the technique for future industrial applications. Most commercially available plasma sputter sources provide a small proportion of ionized species to the depositing film (<5%). Most of the energy supplied for non-equilibrium growth is supplied by the thermal velocities of the depositing species. The thermal distribution of these velocities is necessarily broad, allowing little control over specific growth processes at the film growth interface. Because the energy supplied by the depositing species is kinetic, it is often difficult to provide high energies to the growth interface with out simultaneously causing subsurface damage, due to the recoil and implantation of the bombarding atoms.

Several modifications have been devised to render greater control over plasma sputtering processes wherein, as in the present invention, excited state and ion populations in the gas/vapor phase are increased and manipulated by means external to the sputtering plasma. This is most commonly accomplished by injecting electrons into the sputtering plasma to increase the plasma density and ion population, while simultaneously allowing a decrease of the target voltage. A resulting benefit is the ability to introduce a high proportion of relatively low energy ions to either etch or deposit on the substrate. This method has been made popular in the well-established triode and tetrode sputtering configurations, wherein electrons are usually supplied by a thermionic filament. This latter art has been found to work well for the deposition of metals, but is not compatible with reactive processes where electron emitting surfaces are prone to modification.

In recent years, plasma sputtering processes have also been developed that increase ionization through the utilization of secondary coils or antennas for RF or microwave excitation of the plasma. This latter prior art has also been found useful in the deposition of metals. However, difficulties arise, in that resonance conditions are effected by the inevitable modification of the process chamber surfaces during deposition, especially when depositing insulating or semi-insulating materials; also, these latter developments offer little resolution of the plasma species to be ionized.

The use of sources of UV/optical energy in conjunction with sputtering plasmas is relatively limited compared to the prior art concerning electron sources. In various instances, plasma sputtering experiments have been conducted utilizing the geometry set forth in U.S. Pat. No. 4,664,769 issued May 12, 1987 by Cuomo et al. This patent teaches a method wherein a UV source is directed onto a sputtering target during the magnetron sputtering process. The UV wavelength used is of an energy of or exceeding the photoelectric threshold of the target material, thereby causing the target to emit photoelectrons into the sputtering plasma. This photoelectric addition of electrons is found to increase plasma density, lower the cathode voltage required to sustain a discharge, as well as to increase the ion flux to the substrate, enabling modification of the film properties. As this work focuses on the irradiation of the sputtering target, its operation is contradictory to the goals of the present invention.

The use of UV/optical sources with magnetron sputtering plasmas in later work has consisted of efforts wherein a UV source, usually a laser, is directed upon the substrate being processed. These experiments are conducted in order to promote and study various surface reactions and solid phase transformations at the substrate surface, sometimes with a reactive gas injected at the substrate. As such, these accounts deal with UV interactions with the substrate surface and do not anticipate the present invention.

The use of UV/optical radiation sources in combination with processing plasmas has consisted mostly of the research conducted in relatively higher pressure photo-enhanced and plasma-enhanced chemical vapor deposition (CVD) processes. In the relevant accounts, ultraviolet radiation, usually from a laser, irradiates the substrate upon which the thin film is being deposited. This work in CVD was originated by Hargis, Gee, et al, and reported in the publications, "Laser-plasma interactions for the deposition and etching of thin-film materials", wherein is described the mechanism by which laser-produced UV activates the top monolayers which are plasma-deposited on the substrate.

This initial work utilizing both plasmas and UV radiation sources in CVD has continued. Researchers have since found that the plasmas used for plasma-enhanced CVD and plasma-enhanced chemical etching may be simultaneously or separately used as a photochemical UV source. The interaction of UV with these plasma-enhanced CVD and chemical etch processes has been found to take place primarily in surface modifications, such as in photo-activation of heterogeneous surface reactions at the substrate surface; because of this, these process geometries must incorporate means for illuminating the substrate surface which is being modified. Any photo-activated gas-phase reactions which might, in addition to the surface interactions, occur in these CVD and chemical etching plasmas would be essentially non-existent in the low-pressure, higher power density sputtering plasmas; nor are such gas phase reactions a necessary element of the present invention.

While the use of UV sources is a promising route for enhancing and controlling film growth and etching processes in plasma processing, the aforementioned prior art has had little impact on sputtering deposition/etching applications. Reasons for this are viewed, in the present invention, in light of the highly non-equilibrium thermodynamic mechanisms inherent in plasma sputtering technology. While the plasma sputter source provides a reliable means for depositing many materials under a wide range of conditions, consistently achieving a specific resultant film structure and composition, within relatively tight tolerances, remains a formidable challenge. Introducing additional energy sources to the sputtering plasma further complicates issues of stability and repeatability.

The prior art invariably utilizes process-altered surfaces which receive UV energy, namely the sputtering target or the substrate; but, in addition, chamber walls and fixturing. Any solid surfaces which might potentially receive UV radiation must act as a transmitting, reflecting, absorbing, or scattering surface. Because these process surfaces tend to be altered during the deposition process, the interaction of the UV source with the deposition process is also altered. As the reflectivity, scattering, and absorption occurring at these surfaces changes with process time, plasma-related mechanisms occurring throughout the process volume, such as secondary electron emission, gas/vapor photo-excitation, radiant heating, and photon-assisted sputtering, can all be dramatically altered. Hence, UV radiation incident on a growing film, or on the sputtering target, can interact with the deposition process in an unstable fashion.

The terms "plasma" and "discharge" both refer herein to the general sense of an electrically or electromagnetically sustained, photo-emitting, gas/vapor discharge, wherein quasineutrality of the gas/vapor may not necessarily exist. While the term "plasma" has been used more restrictively, and certainly more inclusively, than in the definition offered herein, the latter definition is consistent with current-day usage in the semiconductor industry, vapor deposition sciences, and other areas where the present invention might find application. The two terms are utilized differently in the present disclosure as a means of clearly differentiating between the sputtering "plasma" of the preferred embodiment, and the photoemitting "discharge" of the disclosed ultraviolet lamp source.

In disclosing the present invention, the terms "cavity", "reflective cavity", and "optical cavity", will all refer to the common and general sense of a predetermined structure for confining propagation of optical radiation between reflective surfaces.

SUMMARY OF THE INVENTION

In accordance with the illustrated preferred embodiment, the present invention provides a sputtering apparatus and method for the deposition of material on a workpiece, using intense ultraviolet (UV) radiation, including vacuum ultraviolet (VUV; λ<200 nm) radiation, to irradiate vapor constituents of a sputtering process. In particular, the sputtering apparatus disclosed herein allows a very high degree of optical coupling, as well as a high symmetry and a high selectibility of optical coupling, between a high power, UV-producing lamp discharge and the sputtering plasma.

In its first preferred embodiment the invention includes a central circular magnetron electrode for sustaining the sputtering plasma, a peripheral optical aperture located above the electrode, a separate concentric volume containing means for generating high power, narrow-band UV emission, a concentric reflective cavity, means for positioning a workpiece to receive depositing species, and optical interference and collimation means for control of the UV emission within the sputtering plasma. The sputter source described herein utilizes the aforementioned UV processing apparatus, which confines UV radiation to propagate within a planar process space above the sputtering target ("above the target" will, throughout this text, refer to the side of the target exposed to vacuum). The energy and radiation density of the UV radiation produced by the disclosed UV apparatus is sufficient to ionize a vapor or gas constituent of the sputtering plasma.

Whereas the use of UV radiation offers the potential for highly resolved interactions with specific plasma species, prior plasma sputtering art utilizing UV has not been developed significantly as a production method. Prior art plasma sputtering experiments utilizing ultraviolet energy for altering plasma sputtering processes have invariably required direct illumination of a processing surface, namely, the target or workpiece; many of these interactions are found in the present invention to be inherently unstable and difficult to control in a sputtering environment. These latter UV-surface interactions also tend to dominate the photoabsorption process, especially at the low pressures used in sputtering processes, thereby severely limiting the proportion of the UV radiation actually absorbed through UV-vapor interactions. In the present invention, through the efficient containment of UV spectral emissions, effective collimation of the UV, and a symmetric distribution of UV about the sputtering plasma's major axis of symmetry, a high density of UV radiation is available for stable and repeatable photo-excitation and/or photo-ionization of the gas/vapor-phase plasma species; at the same time, the interactions of this UV energy with the target, workpiece, or other process-altered surfaces, are profoundly reduced. Another related advantage of the UV source of the present invention, in its capacity as a UV-assisted processing apparatus, is the possibility of reducing UV-induced damage at the workpiece being processed.

The present invention provides a new and versatile method for fabricating thin film structures by enacting a greater degree of control over both the sputtering plasma parameters, and the nature of plasma-emitted particles, than conventional plasma sputtering processes. One advantage of the present invention is that it introduces a means for increasing ion densities in a repeatable, low-cost method. The present invention, in its preferred embodiment, offers distinct advantages over the prior art as a method for producing high ion densities in or above the sputtering plasma. This increase in ion density is achieved by using well-resolved, photo-ionizing UV-plasma interactions, in a configuration which substantially reduces the interaction of ionizing radiation with any process-altered surface. A resulting advantage is the introduction of a both repeatable and highly tailorable process for increasing ion densities in and/or above the sputtering plasma.

Another advantage of the present invention is the increased control allowed in achieving specific compositional or structural characteristics in the thin (or thick) film structures formed. The selective and reproducible ionization of a specific species in, or above, the sputter plasma allows control over the kinetic and chemical energies of those specific atomic or molecular species at the growth front of the film. The ability to control ion fluxes, chemical energy, and kinetic energies in vapor depostion are powerful tools in controlling the microstructure and crystallinity of a deposited film. Because of the thermodynamic non-equilibrium nature of the sputtering process, it may produce material phases and phase combinations not possible in more thermodynamically equilibrium processes, such as evaporation or the earlier diode sputtering. This is due to the energies supplied by the depositing atoms, and their reactions, at the growth interface, being representative of temperatures far exceeding that of the bulk temperature of the workpiece. Hence greater latitude in controlling these energies via mean free path (i.e., pressure) and ionization greatly increases the latitude available in achieving a particular film structure. At the lower sputtering pressures possible with higher ion densities, the resultant films deposited will also tend to contain less contamination by the sputtering gas (e.g., argon). This will, in turn, minimize structural defects induced by these gases, enhancing the use of sputtering as an epitaxial technique.

Higher ion fluxes in sputtering also greatly enable the effort to perform so-called metallic-mode reactive sputtering, wherein the target remains metallic during deposition and the reacted product is formed at the workpiece, as chemical activity of the metal atoms at the workpiece is greatly enhanced. This latter method is important for high-rate sputtering of dielectrics, as well as providing a promising technique in sputter epitaxy. Other objects related to the present invention follow.

An object of the present invention is to provide a means for increasing the density of ionized and excited species in or above a sputtering plasma.

Another object of the invention is to provide a means of irradiating the sputtering plasma and/or adjacent vapor with a high density of UV energy, in a mamiler which isolates the volume and nature of UV interaction.

Another object of the invention is to provide ionizing UV energy to plasma species without producing UV-induced damage at an adjacent workpiece.

Another object of the present invention is to provide a self-contained means of irradiating dispersed photo absorbing media.

Another object of the invention is to provide a novel, plasma-sustaincd ion source for the development of sputter-assisted processes.

DESCRIPTION OF THE PREFERRED EMBODIMENTS

The following description and FIGS. 1 through 6 of the drawings depict various embodiments of the present invention. The embodiments set forth herein are provided to convey the scope of the invention to those skilled in the art. While the invention will be described in conjunction with the preferred embodiments, various alternative embodiments to the structures and methods illustrated herein may be employed without departing from the principles of the invention described herein. Like numerals are used for like and corresponding parts of the various drawings.

Figure 1:
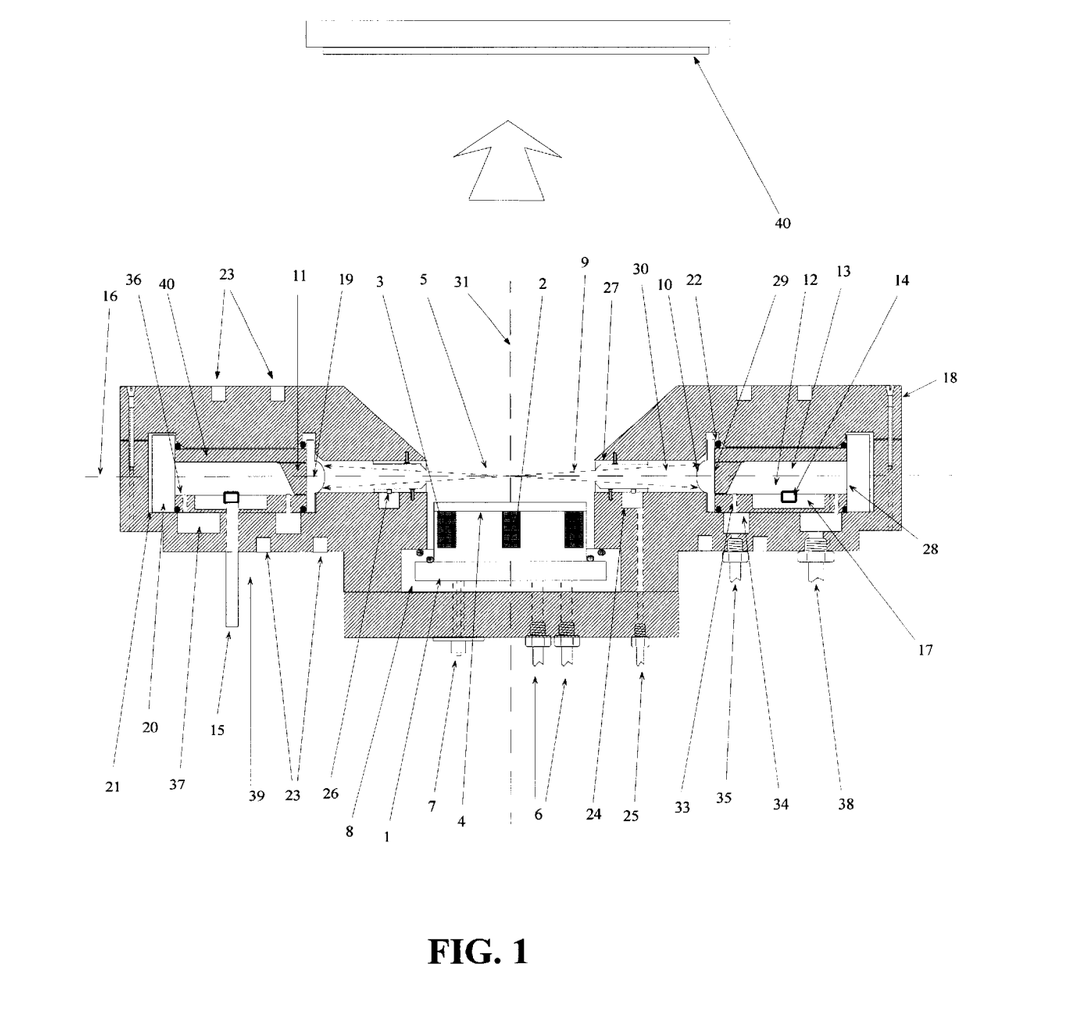
FIG. 1 is a sectional side view of a first embodiment of the present invention . The viewed cross-sectional plane contains the central axis (31) of circular symmetry, so that the viewed plane divides the device in half.
Figure 2:
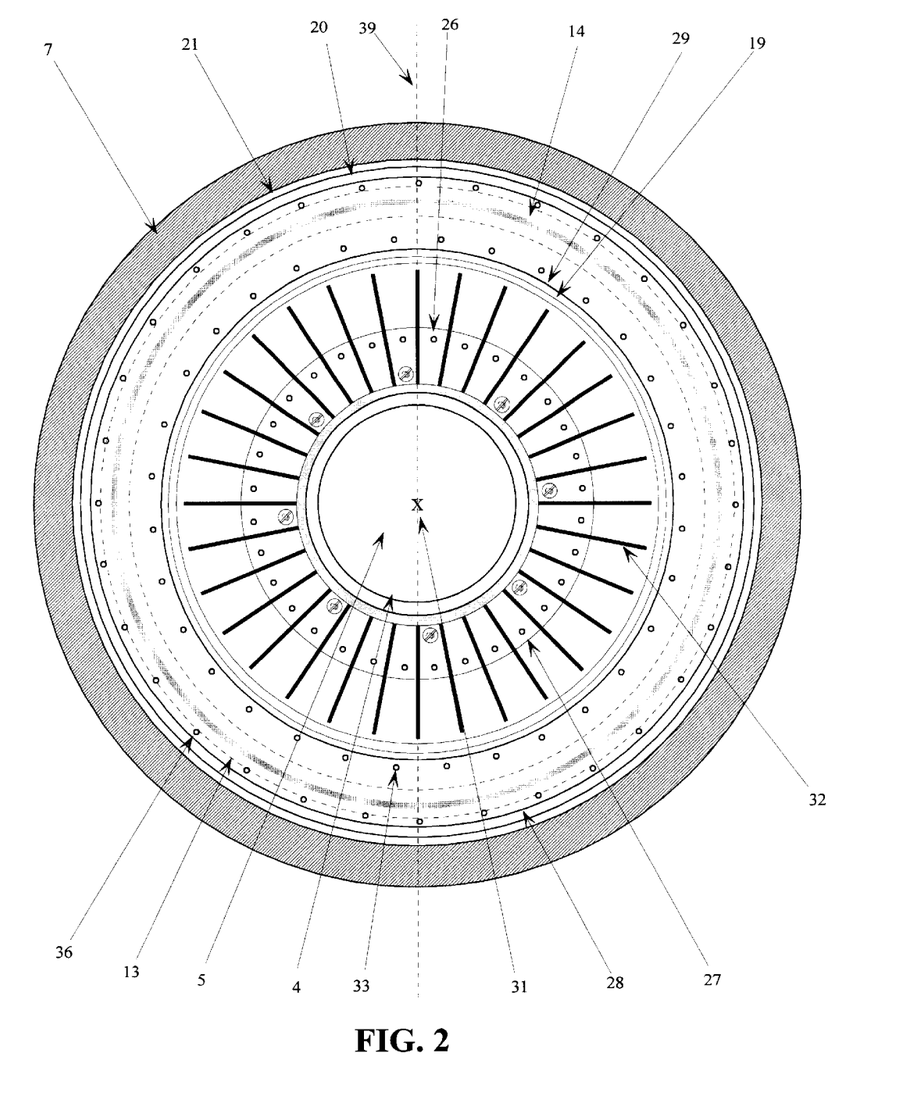
FIG. 2 is a sectional top view of the invention as constructed in FIG. 1, with the section taken along the line (16) of FIG. 1, and illustrates the circular symmetry of the device, as well as the additional reperesentation of the opional baffle assembly (32).

In one aspect, the present invention is disclosed herein as a vapor deposition apparatus utilizing, in the preferred embodiments, a plasma sputter electrode, and in particular, plasma sputter electrodes of the circular magnetron variety. In FIGS. 1–2, the present invention is shown, in its first preferred embodiment, using a circular magnetron sputter electrode (1), in which the plasma (5) is confined by a generally toroidal magnetic field formed by a concentric arrangement of central and outer magnets, where the central magnet assembly (2) is of opposite polarity of the outer (generally annular) magnet assembly (3). Many specific designs for the magnetron sputter electrode have been previously set forth in the art, wherein is disclosed various arrangements of field-shunting elements, auxiliary magnets, relative magnet strengths, and cooling strategies. Some of these latter considerations will be addressed when relevant to the disclosure of the preferred embodiment. In a manner consistent with the existing art, cooling water and power are supplied to the magnetron electrode via connections (6) and (7), respectively; and the electrode is appropriately insulated from adjacent surfaces by an electrical insulator (8). In FIG. 1, as in the other side view drawings of the present disclosure, the vertical dashed line (31) running through the center of the figure indicates the axis of rotational symmetry.

In the preferred embodiment, the sputter electrode (1) is integrated within the UV optical cavity housing (18) to form a single modular deposition source, therein allowing convenient and stable alignment of the UV optical cavity and sputter electrode. The sputter electrode is positioned within the UV optical cavity housing, so that UV radiation may converge into the sputtering plasma volume via the annular aperture (30), after transmitting through the concentric and annular fused silica window (19). The propagation of UV energy is designated in FIG. 1 by the dashed paraxial rays (9). Outside and approximately concentric to this said window is an annular primary reflector (20), also constructed from fused silica. The inside surface of this primary reflector is coated with a multilayer dielectric (MLD) reflector (28), and is sufficiently removed from the UV-producing lamp discharge (13) to prevent unnecessary degradation. The reflector (28) can be fabricated variously, but, in the preferred embodiment, is comprised essentially of a large, odd number of alternating quarter-wave layers of low and high refractive index dielectrics.

The annular window (19), surrounding the sputtering plasma periphery, allows the lamp discharge to operate at a gas composition and pressure that can be controlled independently from that of the sputtering process. It may be preferable, for some applications, that this window be constructed of $MgF_2$, $CaF_2$, or LiF, or other, single crystal, VUV-transmitting materials. However, these single crystal windows have many drawbacks; they tend to be relatively soft, can solarize easily, and are far less resistant to thermal shock than fused silica. The fluoride window materials are also relatively expensive, even if used in the simple form of segmented, planar windows. On the other hand, fused silica can readily be polished to a higher quality surface than the fluorides, is more easily cleaned, and can be fashioned into the preferred window/lens geometry. High quality fused silica (e.g., Schlieren-grade Suprasil), is therefore used as the window material in the preferred embodiment of FIG. 1. High grade fused silica will typically transmit at optical wavelengths down to 160 nm, corresponding to energies below about 7.9 eV; though, the flouride windows will offer greater transmission at these shorter wavelengths. In this way, radiation, of energy equal to or exceeding the ionization potentials of many elements and molecular species, can be focused into and/or above the sputtering plasma. In Table 1 are found a list of industrially important elements for which the ionization potentials are less than 7.9 eV. Of course, if higher energies are required, fluoride windows will be necessitated, with LiF crystal windows (although hygroscopic) transmitting down to 105 nm.

TABLE 1

Ionization Potentials of various elements.

| element | energy (eV) | element | energy (eV) |
|---|---|---|---|
| Al | 5.986 | Gd | 6.15 |
| Bi | 7.289 | Li | 5.39 |
| Ce | 5.539 | Mo | 7.09 |
| Cr | 6.767 | Nb | 6.759 |
| Cs | 3.894 | Nd | 5.525 |
| Er | 6.108 | SrO | 7 |
| Ga | 5.999 | Ti | 6.828 |

A difficulty in employing a transmitting window in the proximity of any vapor deposition process lies in the need to prevent material from depositing on the transmitting surfaces. While the low aspect ratio of the UV optical cavity's process space allows more precise control over the interaction mechanisms occurring in the sputtering plasma, it also aids in preventing the contamination of those optical surfaces which couple UV into and out of the sputtering plasma. In the preferred embodiment, an annular cavity (30) is formed by the UV optical cavity housing (18) which significantly reduces line-of-sight contamination from the sputtering plasma. Although the devices in FIGS. 1–6 utilize a particular ratio of window radius to sputter electrode radius, the relative size of the window and reflector radii can be scaled up so as to substantially remove the transmitting surface(s) from the proximity of the sputtering plasma. As the mean free path (m.f.p) of gas and vapor species will remain constant under identical process pressures, the probability of window contamination will decrease substantially for cavity path-lengths far exceeding the m.f.p. of the chamber background pressure. This scaling up of the cavity radii relative to a given sputter electrode will also enable the use of far higher powers by which to sustain the lamp discharge(s), and hence, higher radiation densities available in and/or above the sputtering plasma.

Increasing the m.f.p. within the annular cavity is achieved with the field stop (27), the latter which, aside from enabling more precisely controlled UV interaction with the sputtering plasma, aids in the prevention of window contamination in two ways: first, the field stop significantly prevents sputtered vapor from entering the annular cavity region, where both line-of-sight and scattered vapor paths may result in window contamination, and second, the field stop effectively throttles process gases which are emitted into the annular cavity via gas supply inlet (25), ballast channel (24) and a symmetrical arrangement of gas ports (26). The latter throttling effect allows the m.f.p. within the annular cavity to be much smaller, especially at high flow rates, than the process pressure, further ensuring the high scatter and subsequent gettering of sputtered vapor by the cooled surfaces of the annular cavity. This gettering can be increased by the optional implementation of radial dividing surfaces (32), depicted in FIG. 2, between the upper and lower surfaces of the annular channel, which also lowers conductance for the exiting process gas. The gas ports (26) are appropriately small and sized to provide even distribution of process gases throughout the annular channel. The entire aperture baffle assembly is constructed from aluminum alloy for high thermal conductivity to the cooling lines (23).

When the luminous power density supplied by the lamp discharge is sufficiently high, at energies equal to or exceeding ionization potential(s) of the process vapor species, the process vapor atoms approaching the window will increasingly tend towards being in an ionized state. This allows the further elimination of deposition on the window, as these ionized particles may then be electrostatically pumped and cold-trapped by the grounded (or electrically biased) surfaces in the annular channel.

These aforementioned methods for eliminating deposition of material on the annular window may be used separately or in combination. The most effective solution will depend on the particular process. In some instances, it may be easier to periodically clean the window, rather than to employ many vapor-trapping surfaces within the annular channel. When geometry allows, it may also be advantageous to increase the diameter of the annular window (and the UV source) to sufficiently preclude its contamination.

The discussion so far has focused on the design of an optical cavity which maximizes the optical energy present, at wavelengths of interest, for optically coupling the sputtering plasma (5) and a lamp discharge (13), in a rotationally symmetric distribution. The present disclosure will now proceed to discuss the lamp discharge. While other means may be utilized to pump a photoemitting gas, such as laser pumping or electron beam pumping, the discharge sources, and in particular, low pressure, excimer-based discharge sources, are particularly well-suited for use in the ultraviolet lamp source disclosed herein. Commercially available ultraviolet sources, such as low pressure Hg lamps, and common discharge gases, such as $N_2$, can produce UV emissions in the range of interest. However, the rare-gas dimers and rare-gas monohalides are preferred for efficient production of narrow-band emission in the far UV and VUV range below 250 nm, particularly the rare-gas monohalides, in which the well-known "harpooning" reactions allow particularly high cross sections in creating the excited molecule. In Table 3, various excimer transition wavelengths are shown. The use of these luminescent exciplex molecules in incoherent emission discharge sources, or examples, allows high efficiency and high power output, in narrow spectral bands centered about these excimer transitions. At low pressures (typically <20 torr), stable, continuous discharges may be readily sustained; and, simultaneously, the reduction in such mechanisms as collisional quenching produce a commensurate drop in non-radiative decay processes. This, and the lack of pressure-broadening at these lower pressures, apparently enables a resulting UV-visible emission spectra consisting in many cases of primarily a narrow (B-X) excimer band, accompanied only by nearby, much weaker, transitions such as the shorter wavelength excimer (D-X) band.

TABLE 3

Excimer transitions of selected gases

| $Kr_2$ | $Xe_2$ | ArF (B-X) | KrCl (B-X) | XeCl (B-X) |
|---|---|---|---|---|
| 146 nm | 172 nm | 193 nm | 222 nm | 308 nm |

Figure 3:
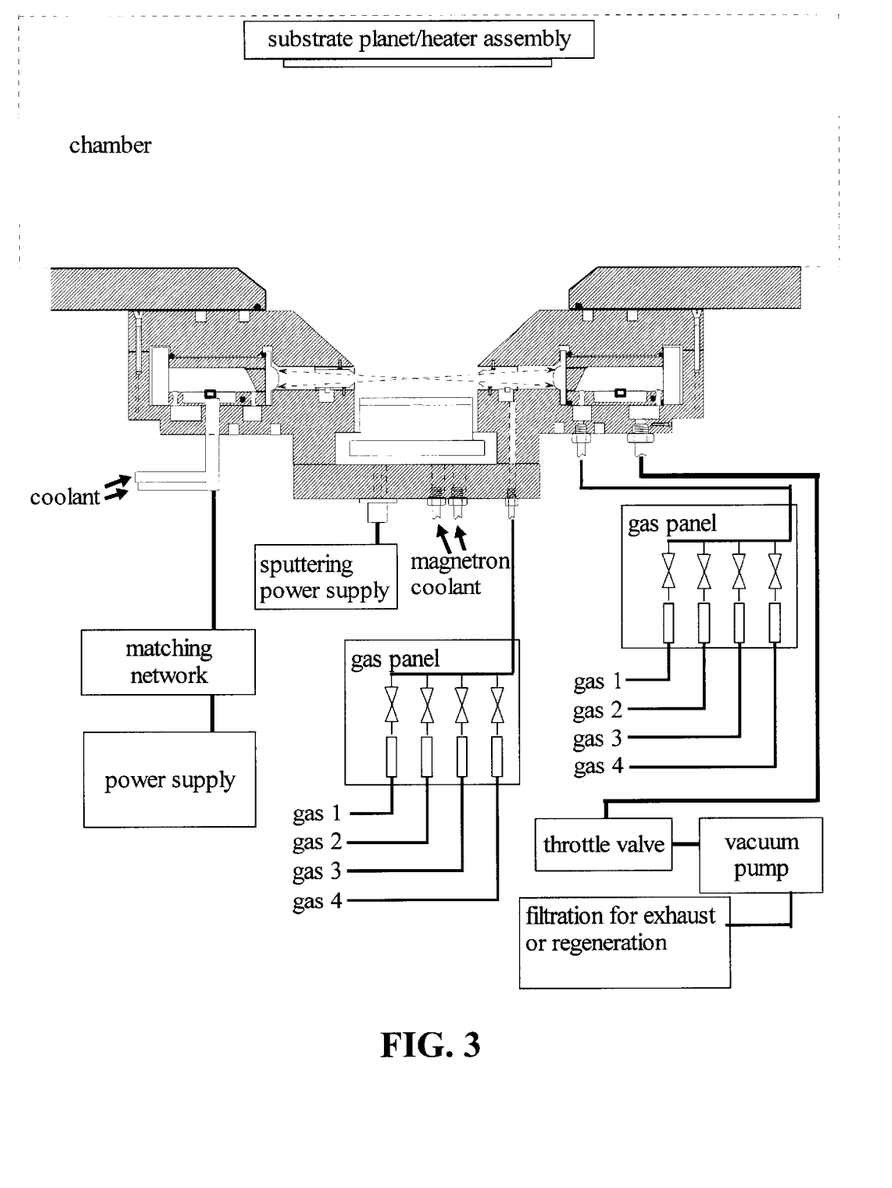
FIG. 3 is a general schematic illustrating typical related equipment used in the operation of the present invention in the first preferred embodiments of FIGS. 1 and 2.

In FIG. 3, the UV optical cavity, as illustrated in the previous discussion and FIGS. 1 and 2, is depicted in the context of the typical accompanying equipment required for its operation. In the embodiment of FIG. 3, the use of a gas flow in the lamp discharge is used to maintain reliable spectral emission; though, sealed-off UV sources might also be used, as they are made available. The use of such expensive gases as xenon would typically involve regeneration of exhaust gases in a recirculating gas flow.

Figure 4:
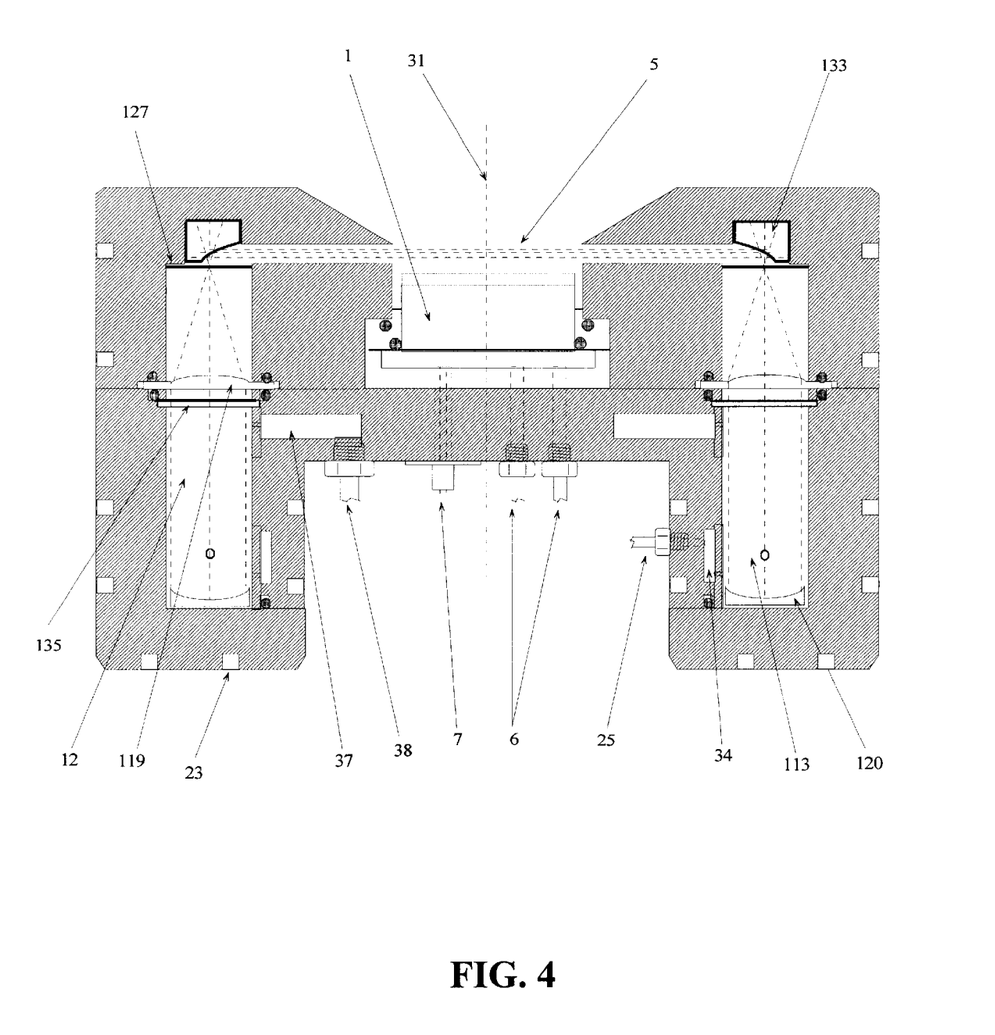
FIG. 4 is an alternative embodiment of the present invention. As before, the plane of the cross section contains the central axis (31) about which the device possesses circular symmetery.
Figure 5:
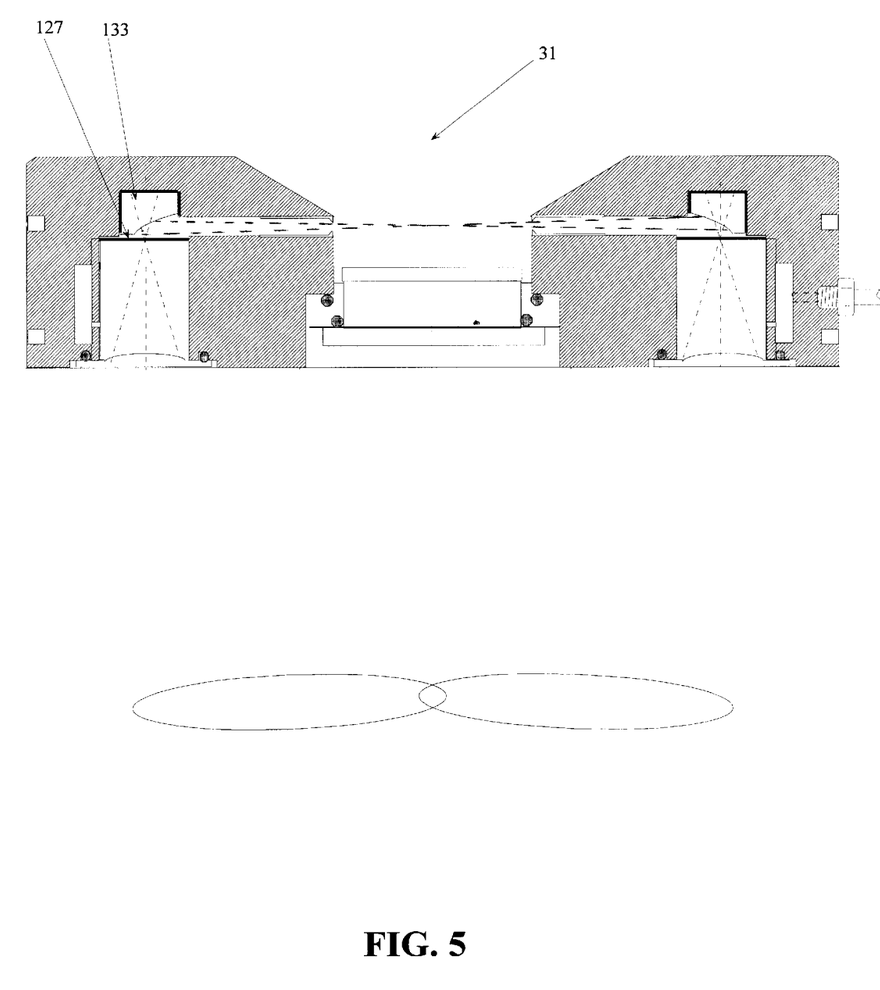
FIG. 5 is a partial side view and accompanying geometric figure illustrating the alternative use of an elliptical vertical cross section for the secondary reflector.
Figure 6:
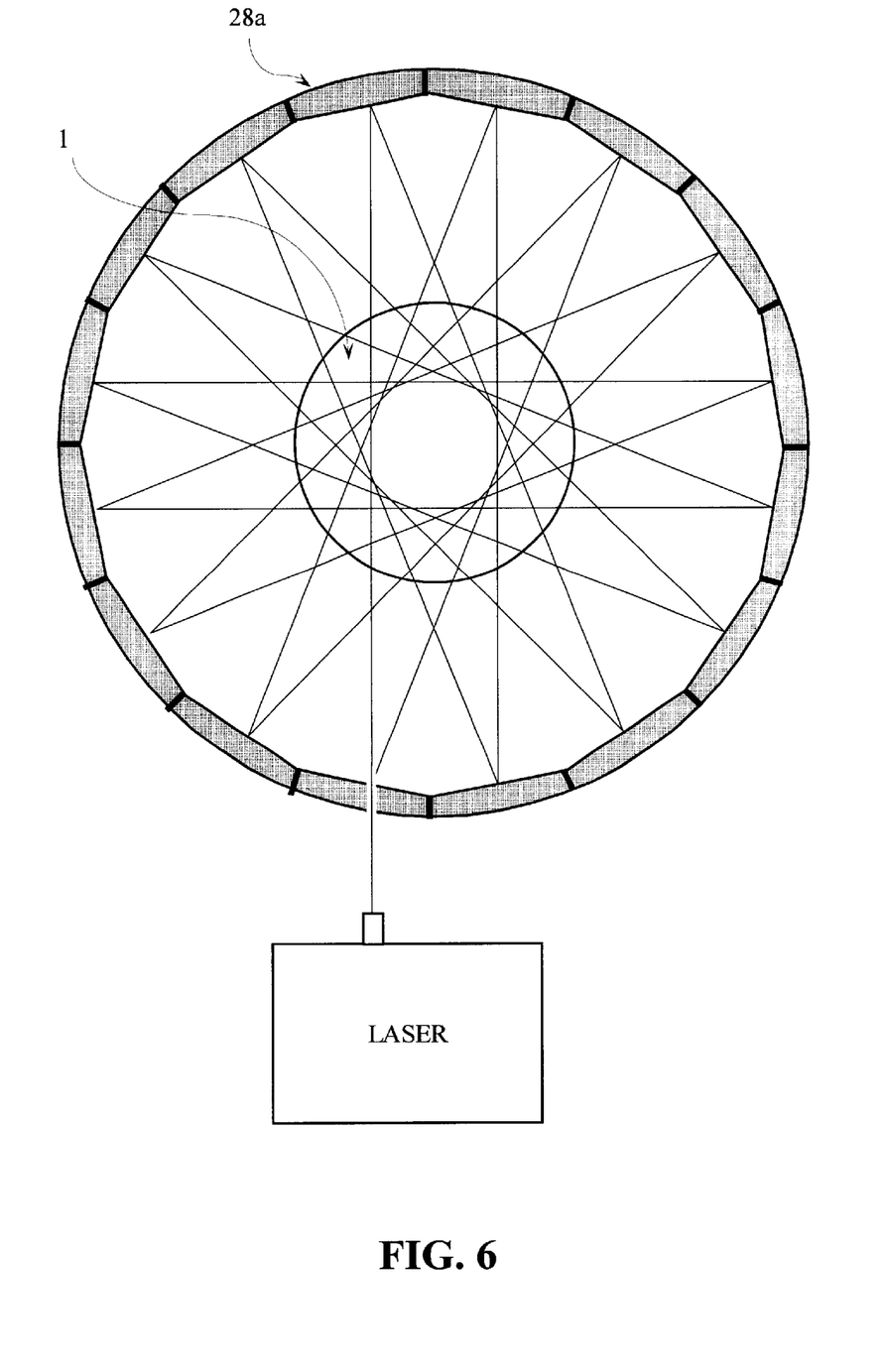
FIG. 6 is a general schematic illustrating the use of a laser and segmented optics in the annular refelective cavity, satisfying the requirement of symmetric transverse UV irradiation of a sputtering plasma.

While the embodiments discussed in the preceding descriptions have been based on the invention as depicted in FIGS. 1–3, other variations, which are portrayed in FIGS. 4–6, will perform the same principle functions, but with various advantages in specific circumstances. The embodiments in FIGS. 4–6 serve, in part, to demonstrate the general use of folding mirrors and other optical elements in the present invention, to expand the range of possible optical cavity configurations. The configuration of FIG. 6 allows the annular window (119), separating the sputtering and lamp discharges, to be placed out of the direct view of the sputtering plasma, hence allowing further means to prevent window contamination. Window contamination is then essentially eliminated by means of the field stop (127). Ultraviolet energy from the lamp discharge is, in both of these variations, re-directed, collimated (again, only in the plane of the drawing), and condensed by means of an annular secondary reflector (133), which, in FIG. 6, is depicted with an off-axis parabolic reflector, the foci of which corresponds to the image foci of the toroidal thin lens (119), as well as to the aperture center of the annular field stop (127). While the deposition of material on the window (119) by the sputtering plasma can be completely avoided through the embodiments of FIG. 6, material adsorption on the secondary reflector (133) can be avoided by the same methods described for preventing window contamination in the embodiments of FIGS. 1–3. The ability of the secondary annular reflector to condense the propagation of the UV to a physically thin planar volume also allows a means for narrowing of the cavity aperture exposed to the sputtering plasma. In many cases, contamination of the secondary reflector will be less critical than in the case of the window of the invention's first embodiment, especially when the contaminant is of a highly UV-reflecting metal (e.g., aluminum) and does not drastically reduce reflectance. Contamination of the secondary reflector is also less an issue as the secondary reflector may be considerably further displaced from the sputtering plasma than the window of the first embodiment, given the same reflective cavity diameter. The passage, for use within the process volume, of UV collimated so as to propagate only within the reflective cavity, is further insured by the use of the annular field stop (127).

The alternative embodiment of the invention as depicted in FIG. 4 may offer advantages over the first embodiment of FIGS. 1–3, in terms of providing economical design and further preventing window contamination. The alternate configurations of FIG. 4 will also allow for maintaining a large lamp discharge volume where space constrictions preclude use of the embodiments of FIGS. 1–3. The alternative embodiment of FIG. 4 also shows an optional second window (135) which may be placed in the optical path, before the thin lens, to perform the function of an interference filter. This planar window, when fabricated as an etalon, would allow an increase in finesse when used in combination with the thin-film filter.

The secondary reflector (133) may, instead, be fabricated with an off-axis elliptic cross-section, which, in FIG. 5, allows focusing of the UV along a focal axis parallel to the magnetron axis (31), as was illustrated by the converging paraxial rays (9) in FIG. 1. By designing the off-axis reflector with an elliptic cross-section, the field stop configuration (27) shown in FIGS. 1 and 2 may be similarly used to prevent adsorption of material onto the off-axis secondary reflector (133), in FIG. 5. The two intersecting ellipses, depicted underneath the side view presented in FIG. 5, demonstrate the cross sectional figure required of the annular secondary reflector (133), wherein the outer foci of the two ellipses coincide with the field stop (127) aperture, and the two ellipses share the same focal point at the central axis (31), which may preside within or, as in FIG. 5 above the sputtering plasma.

For spheric or a spheric reflector cross-sections that have shorter radii of curvature, and must reflect a broad range of angle-of-incidence, a broad-band protected aluminum reflection coating would typically be preferred. While aluminum broadband reflection coatings can provide high reflectivity (>90%) even for UV below 200nm, some degradation tends to occur even for aluminum coated with a thin (e.g., ½ wave) dielectric protective layer. However, because of the wide range in angle-of-incidence, metallic reflective coatings may be preferred for the off-axis secondary reflectors utilized in FIGS. 4 and 5. Anti-reflection coatings (10) deposited on the annular window (19) may also be designed variously, depending on the application. While many existing designs may be incorporated, the narrow-band requirements of the preferred embodiment allow a relatively simple three-layer "V-coat" to perform quite adequately.

While the vapor deposition apparatus described herein is proposed, in its preferred embodiment, to utilize continuous optical elements and a continuous lamp discharge, it can also be similarly demonstrated with segmented optical elements, and/or with segmented lamp discharges. Rather than using a continuous circular window, one might utilize several windows above the periphery of the sputtering target, arranged in a circular or polygonal geometry to achieve a similar cavity effect. The same variation could be utilized in the design of either the reflector surfaces or lamp discharge, as well, with the same result of an effective UV producing cavity; and this same cavity producing an effectively delimited planar volume of UV radiation over the vapor deposition source. The UV source might also comprise a coherent UV source, such as an excimer laser. This variation is represented in FIG. 6. As can be seen in this schematic, the segmented reflector (28a), allows the uniform concentration of UV energy within a concentric volume above a circular sputter electrode (1). While the degree of rotational symmetry can be varied with the number of beam paths over the electrode, the desired result is that obtained by uniform irradiation of a symmetric volume about the sputtering plasma's major axis of symmetry.

One intended application, utilizing the apparatus and method disclosed herein, is the sputter epitaxy of AlN, GaN, InN, and the ternary and binary combinations of the same. With a high quality fused silica window, greater than 90% transmission is possible for ultraviolet radiation of wavelengths above about 190 nm. This is adequate for photoionization of Al, Ga, and In, all of which have ionization potentials of about 6 eV, or about 210 nm. Using the prominent discharge emission of the ArF* (B-X) band at 193 nm, it is possible to generate and store hundreds of watts of UV power within the reflective cavity. As the wavelengths of these UV emissions will be centered near the peak absorption cross sections for photo-ionization of aluminum, gallium, and indium vapors, the ionization rate of these plasma constituents will be significantly increased. The use of high purity nitrogen, $NH_3$, or suitable nitrogen-containing molecule, as the sputtering gas would allow the deposition of these nitrides with well controlled excitation of the deposited species, with no contamination due to the sputtering gas. In the device as fabricated, the magnetron sputter electrode is constructed using an electromagnetically variable magnetic field. By altering the magnetic field, various degrees of "unbalanced" magnetron behavior may be obtained; this will, in turn, vary the degree of bombardment of the workpiece by ions and electrons. Nitrogen admitted at the workpiece will then have a tendency for being ionized by the bombarding electrons, depending on the chosen variation in the magnetron's magnetic field. In this way, one is capable of enhancing, and controlling the degree of, the kinetic energy of the Ga and N atoms arriving at the workpiece, the excitation state or ionization of the Ga atoms, and the ionization of the N atoms. All of these mechanisms are capable of adding significant amounts of non-equilibrium energy to the growth front of the crystalline thin film. In conventional sputtering of metals, the kinetic energy of the depositing species dominates; dense films are acquired at the expense of creating extensive sub-surface damage, as is described in the well-known Movchan-Demchishin-Thornton model of physical sputtering. The resultant film growth regimes of metal target reactive sputtering have been found far less predictable, and are far less understood. For instance, by ensuring a high proportion of monoatomic, activated species are available at the workpiece, more of the energy deposited at the growth interface will be available for increasing adatom mobility; rather than that being dissipated in the recoil of impinging, high velocity neutrals, most of this latter inertial energy being expended in the creation of various structural defects, as well as in the heating of the underlying film. By exercising this high degree of control over interactions at the growth interface, films possessing relatively high degrees of crystalline perfection may be achieved.

The invention disclosed herein possesses additional utility in the deposition of nitrides of Ga, Al, and In, as well as other compounds, when a multi-component target is used (such as combinations of Ga In, and Al). As the ionization potentials of Ga, In, and Al, all correspond to UV wavelengths of about 210 nm to 211 nm, a strong emission peak of the lamp discharge could be made to preferentially resonate with or exceed these respective energies; this could be achieved via the various spectral line shifting and broadening mechanisms, with pressure broadening and other collision-related mechanisms providing the greater magnitude shifts, and probably the more useful of the teclmiques. Alternatively, by operating several lamps in parallel, emission lines of more than one discharge gas composition could be utilized simultaneously, or in alternation, to preferentially ionize various constituents of the plasma. In this way, the "preferential sputtering", which normally plagues experiments which do not involve proper pre-sputtering of the target, could be utilized to create an alternating film structure; this, via a multi-component sputtering target which is never allowed to reach a dynamic equilibrium in its sputter yield. In a similar way, the more permanent issue of preferential sputtering at the workpiece may be manipulated for a beneficial result. The lamp discharge emission may, in this way, be switched between the resonant ionization energies, or other resonance absorption lines, of specific components in the target. This will effect not only the relative degree and nature of excitation for the different species arriving at the workpiece, but their relative arrival rate, thermal energies, and sticking coefficients, as well. In this way, modulation of the lamp discharge can result in modulation of the resultant film composition and microstructure. Dopant levels, and the nature of dopant incorporation in the film lattice, can be modulated in the same manner. The lamp discharge may also be pulsed in phase with the desired modulation in the resultant film; or at faster rates to produce a desired material phase or orientation in the resultant film.

The utility of this invention as concerns the previously mentioned nitrides will also apply towards many oxides, as well. The deposition of epitaxial $CeO_2$ on single crystal silicon has many potential applications, due to the very small lattice mismatch (<0.1%). With an ionization potential of around 5.4 eV (230 nm), cerium vapor will be efficiently ionized by the KrCl* (B-X) transition at ~222 nm. By operating the Ce sputter source in a metallic mode, wherein the target remains essentially metallic, and Ce metal ions arrive at the workpiece. The ability then exists to control the kinetic energy of these ions through bias sputtering, as well as to enhance the reactivity of the cerium at the workpiece. An added utility of the present invention in the formation of metal oxide films, is that at UV vacuum wavelengths in the area of 180 nm, still transmitted well by high quality fused silica, diatomic $O_2$ is converted into ozone, $O_3$. This transition greatly increases the chemical activity of oxygen, and with the UV power available, $O_3$ could be produced in sufficient quantities to significantly alter the growth process. The chemically active ozone and monatomic oxygen serve well in the reactive sputtering of compounds which tend to deposit in a reduced form, such as indium-tin oxide; also, the possibility exists to operate a source in a glow-discharge-cleaning mode, whereby the source is operated below the sputtering threshold, in a high oxygen content ambient (>100 mTorr), and the activated oxygen is used to alter or clean the workpiece prior to deposition.

Another clear advantage in the proficient ionization of a sputtered metal exists in the deposition of via-filling metal electrode layers in chip manufacturing. The ionization potential of Cu, at 7.726 eV (~164 nm), requires use of a single crystal window material, such as $MgF_2$ or CaF, for efficient transmission. This is most economically accomplished by fabricating the annular window as a segmented, polygonal, array. Using $F_2$ in the discharge gas, typically in a He background, the $F_2$*(D-A) transition at ~157 nm will provide an increase in metal ion in the present invention.

Used in conjunction with optical emission spectroscopy, the lamp discharge could be used as a probe to produce and/or reveal various absorption and emission lines within the plasma. This information may then be used to determine various plasma properties, ionization states, excitation states, electron densities, electron temperatures, ion densities, preferential sputtering, gas-target reaction products and rates, degree of target poisoning by the reactive gas, emitted flux, and the presence of contaminants.

Used with, for example, a spectrograph with CCD data acquisition, transient events could be responded to with real-time process control. Pulsing the lamp discharge would further allow identification of emission and absorption lines in a spatially resolved sputtering plasma. Once resultant film structure and composition are determined as a

What is claimed is:

1. A vapor deposition method comprising the following steps:
    a. positioning a workpiece in a vacuum chamber;
    b. providing a metal vapor source in the vacuum chamber for creating a flux of metal vapor toward the workpiece;
    c. providing a source of ultraviolet radiation for effecting ionization of the metal vapor;
    d. directing the ultraviolet radiation so that the radiation propagates substantially transversely through the metal vapor along predetermined optical paths which include multiple passes through the metal vapor, thereby increasing photoabsorption of said ultraviolet radiation within the metal vapor;
    e. ionizing the metal vapor through photoabsorption of the ultraviolet radiation;
    f. emitting a gas toward the workpiece; and
    g. forming a compound on the workpiece, said compound being derived from components of the metal vapor and the gas.

2. The method of claim 1, wherein the flux of metal vapor is inter-mixed with the gas.

3. The method of claim 1, wherein the flux of metal vapor includes more than one metal.

4. The method of claim 1, wherein the flux of metal vapor is pulsed or modulated.

5. The method of claim 1, wherein the ultraviolet radiation is supplied by a laser.

6. The method of claim 1, wherein the ultraviolet radiation includes multiple ultraviolet frequencies or a band of ultraviolet frequencies.

7. The method of claim 1, wherein the gas is emitted from a discharge.

8. The method of claim 1, wherein bias methods are used to control the ionized vapor.

9. The method of claim 1, wherein the flux of metal vapor passes through an optical cavity.

10. The method of claim 1, wherein the source of radiation is a laser.

11. The method of claim 1, wherein the source of radiation includes an excimer discharge.

12. The method of claim 1, wherein the ultraviolet radiation also activates the gas.

13. The method of claim 1, wherein the workpiece is a semiconductor.

14. The method of claim 1, wherein the compound includes a nitride of Al, Ga, or In.

15. The method of claim 1, wherein the compound includes cerium oxide.

* * * * *

UNITED STATES PATENT AND TRADEMARK OFFICE
CERTIFICATE OF CORRECTION

PATENT NO.     : 6,265,033 B1
DATED          : July 24, 2001
INVENTOR(S)    : Donald B. Hilliard It is certified that error appears in the above-identified patent and that said Letters Patent is hereby corrected as shown below:

Column 13,
Line 51, after the word "a" please insert the attached omitted text.
-- function of the partial pressures and powers for the lamp discharge and sputtering plasma, the spectroscopic information would allow real-time process control of these input parameters to achieve specific uniformity or modulation in the film structure or composition. In the same manner, the capacity for the present invention to probe a circular magnetron plasma with both high radial resolution and circular symmetry will allow for the study and manipulation of particulate formation, charging, and fragmentation in "dusty plasmas".

It is not intended that the UV lamp source, disclosed herein, be limited to use in sputter vapor deposition. For example, between the luminous flux achievable in the lamp discharge, the unique focal point or focal axis due to dichroic filtering, and the high effective numerical aperture of the cavity, power densities adequate for effecting photon-assisted ablation processes could be achieved.

Although the present invention has been described in detail with reference to the embodiments shown in the drawings, it is not intended that the invention be restricted to such embodiments. It will be apparent to one practiced in the art that various departures from the foregoing description and drawings may be made without departure from the scope or spirit of the invention.

Signed and Sealed this

Fourth Day of June, 2002

*Attest:*

*Attesting Officer*

JAMES E. ROGAN
*Director of the United States Patent and Trademark Office*